United States Patent [19]
Park

[11] Patent Number: 6,150,859
[45] Date of Patent: Nov. 21, 2000

[54] DIGITAL DELAY-LOCKED LOOP

[75] Inventor: Boo-Yong Park, Suwon, Rep. of Korea

[73] Assignee: Hyundai Electronics Industries Co., Ltd., Inchon, Rep. of Korea

[21] Appl. No.: 09/201,716

[22] Filed: Dec. 10, 1998

[30] Foreign Application Priority Data

Mar. 2, 1998 [KR] Rep. of Korea .......................... 98/6772

[51] Int. Cl.$^7$ ...................................................... H03L 7/08
[52] U.S. Cl. ........................................... 327/158; 327/149
[58] Field of Search ..................................... 327/149, 150, 327/152, 153, 158, 159, 161, 244, 245

[56] References Cited

U.S. PATENT DOCUMENTS

| | | | |
|---|---|---|---|
| 4,604,582 | 8/1986 | Strenkowski et al. | 327/147 |
| 5,223,755 | 6/1993 | Richley | 327/158 |
| 5,539,344 | 7/1996 | Hatakenaka | 327/147 |
| 5,909,130 | 6/1999 | Martin et al. | 327/12 |

Primary Examiner—Tuan T. Lam
Attorney, Agent, or Firm—Fleshner & Kim, LLP

[57] ABSTRACT

The present invention is directed to a digital delay-locked loop for digitally controlling a clock signal delay time and saving synchronization information in a register. After intercepting an input clock signal, the digital delay-locked loop utilizes the saved synchronization information in returning to the normal operation, and furthermore, detects a shifted delay by using a trigger pulse generator in order to reduce power consumption during the rapid synchronization of an internal clock signal to an external clock signal, saves a delay state corresponding to a maximum value of half the period of the external clock signal to a lock target rising edge of the internal clock signal, and thus synchronization time and operating time of the digital delay-loop are reduced, which results in reduced operation power for the predetermined time. In addition, even when the external clock signal is suspended, a lock point can be rapidly found and thereby mis-operation because internal clock signals in a circuit are not synchronized to the external clock signal can be minimized.

19 Claims, 8 Drawing Sheets

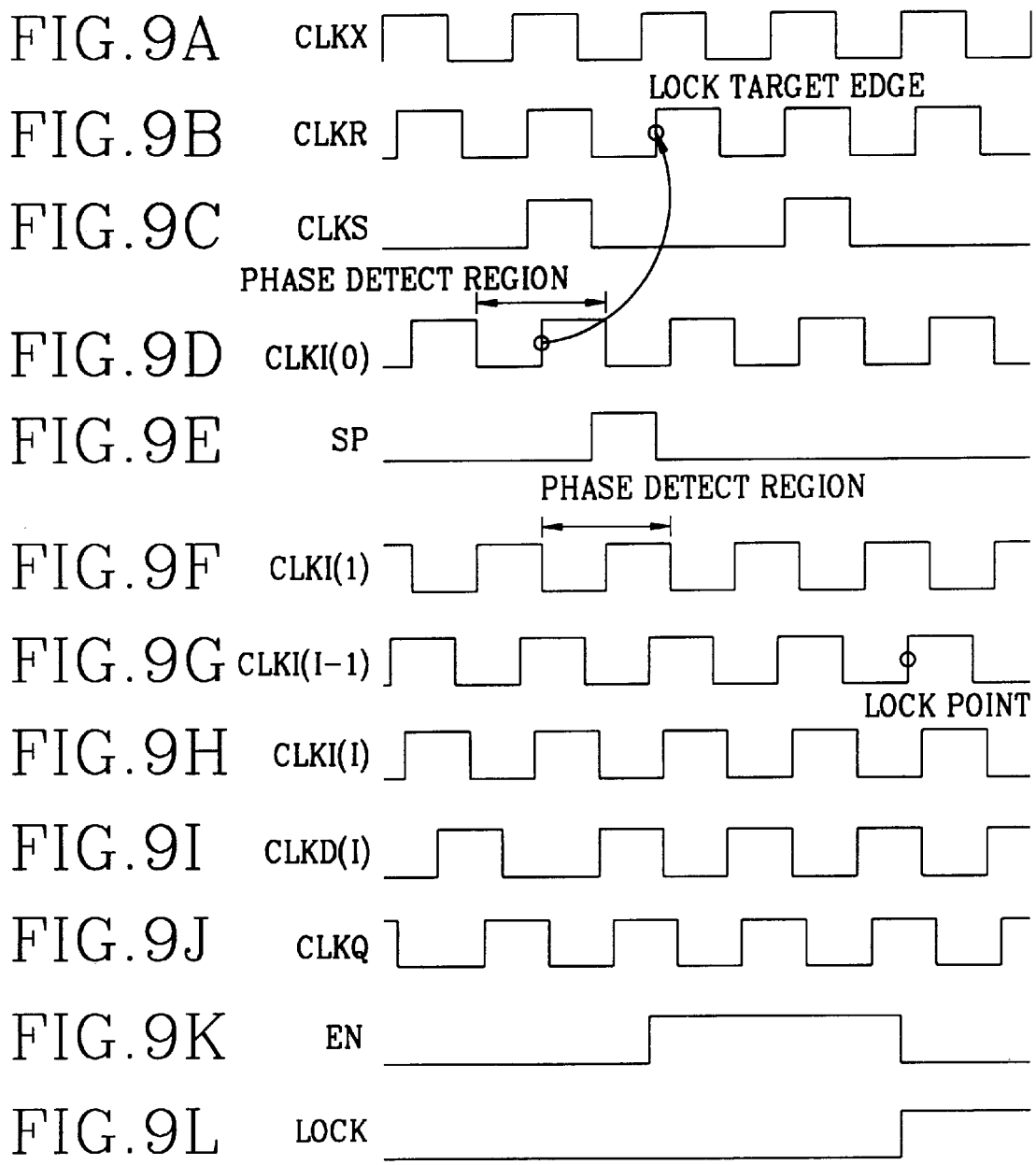

DIGITAL DELAY-LOCKED LOOP

BACKGROUND OF THE INVENTION

1. Field of the Invention

The present invention is directed to a digital delay-locked loop for synchronizing an operation of a semiconductor integrated circuit to an external clock signal, and in particular to a digital delay-locked loop capable of performing a synchronization of an internal clock signal to an external clock signal within a short time by compensating for a delay time of a clock buffer, and repeatedly sampling the external clock signal for low power consumption.

2. Description of the Background Art

A phase-locked loop PLL and a delay-locked loop DLL are utilized for compensating for the delay time generated when an internal clock signal used by an internal circuit is to be operated at high speed in synchronization with an external clock signal which drives a high load capacitance.

As illustrated in FIG. 1, a conventional digital delay-locked loop includes: an input buffer BUF1 buffering an externally inputted clock signal CLKX and outputting the buffered signal CLKR; an internal clock buffer BUF2 buffering a delayed clock signal CLKD and outputting a buffered signal CLKQ for driving an external load capacitance; a reference delay block 10 having a fixed delay element and determining a phase relation of the outputted delayed signal CLKQ with the externally inputted clock signal CLKX and outputting a signal CLKI; a variable delay block 20 consisting of a delay chain 20-1 having unit delay time TD and a register chain 20-2, for controlling the delay time of the delayed clock signal CLKD; and a phase detector 30 comparing the phase of a feedback clock signal CLKI delayed by the reference delay block 10 with that of the buffered input clock signal CLKR.

The phase detector 30 includes: D-type flip-flops DFF11–DFF13 being synchronized by the input clock signal CLKR outputted from the input buffer BUF1; an output logic unit OUTL logically operating the Q output signals of the flip-lops DFF11–DFF13, the inverted Q output signals of the D-flip-flops DFF12, DFF13 and an initializing signal INI, and outputting a synchronous signal LOCK, a shift right signal SHR and a shift left signal SHL; an input logic unit INL logically combining a comparison signal QBEG outputted from the register chain 20-2 of the variable delay block 20, the Q output signal of the flip-flop DFF12 and the inverted Qb output signals of the flip-flops DFF11–DFF13, and driving the D data input of the flip-flops DFF11, DFF12; and a clock divider 30-1 dividing the input clock signal CLKR by two and outputting a sampling clock signal CLKS.

The output logic unit OUTL includes: inverters INV11, INV12 sequentially inverting the Q output signal of the first flip-flop DFF11 and outputting the synchronous signal LOCK; a NAND gate ND11 NANDing the initialization signal INI and the Q output signals of the second and third flip-flops DFF12, DFF13; an inverter INV13 inverting an output signal of the NAND gate ND11 and outputting the shift left signal SHL; an OR gate OR11 ORing the inverted Qb output signal of the second and third flip-flops DFF12, DFF13; a NAND gate ND12 NANDing an output signal of the OR gate OR11 and the initialization signal INI; and an inverter INV14 inverting an output signal of the NAND gate ND12 and outputting the shift right signal SHR.

The input logic unit INL includes: an inverter INV15 inverting the comparison signal QBEG outputted from the register chain 20-2 at the variable delay block 20; an AND gate AND11 which ANDs the inverted Qb output signals of the second and third flip-flops DFF12, DFF13; a NOR gate NOR11 NORing an output signal of the AND gate AND11 and an output signal of the inverter INV15 and driving the D input of the second flip-flop DFF12; a NAND gate ND13 NANDing the Q output signal Df the second flip-flop DFF12 and the inverted Qb output signal of the third flip-flop DFF13; an AND gate AND12 ANDing an output signal of the NAND gate NAND13 and the inverted Qb output signal of the first flip-flop DFF11; and a NOR gate NOR12 where an output signal of the AND gate AND12 and an output of the inverter INV15 and driving the D input of the first flip-flop DFF11.

As illustrated in FIG. 2, in the variable delay block 20, as outputs of the register chain 20-2 are sequentially inputted to the delay chain 20-1 and control it, the input clock signal CLKR is inputted to the delay chain 20-1 and the internal clock signal CLKD is outputted therefrom, and the shift left signal SHL, the shift right signal SHR and the sampling clock signal CLKS are inputted to the register chain 20-2, and the comparison signal QBEG is finally outputted therefrom.

As shown in FIG. 3, the Ith delay block 20-1(I) of the delay chain 20-1 includes: an inverter INV31 inverting an output signal X(I−1) of a next preceding delay block 20-1 (I−1); a transmission gate TG31 controlled by an output signal Q(I−1) of a next preceding register block 20-2(I−1) and the inverted output signal Qb(I−1) thereof, and selecting and outputting an output of the inverter INV31; an NMOS transistor NM31 the drain of which is connected to an output terminal of the transmit gate TG31, the source of which connected to a ground voltage VSS, and the gate of which receives the inverted output signal Qb(I−1) of the preceding register block 20-2(I−1); a transmission gate TG32 controlled by an output signal Q(I) of the Ith register block 20-2(I) and the inverted output signal Qb(I) thereof, and selecting and outputting an output signal Y(I+1) of a next succeeding delay block 20-1(I+1); an inverter INV32 inverting the output Y(I+1) of the delay block 20-1(I+1) selected and outputted by the transmission gate TG32; and a transmission gate TG33 connected between an input terminal of the inverter INV32 and an output terminal of the inverter INV31 and controlled by the output signal Q(I) of the register block 20-2(I) and the inverted output signal Qb(I) thereof, for playing a switching role.

As illustrated in FIG. 4, the Ith register block 20-2(I) of the register chain 20-2 includes: a NAND gate ND41 NANDing the shift right signal SHR and the output signal Q(I−1) of the next preceding register block 20-2(I−1); a NAND gate ND42 NANDing the shift left signal SHL and an output signal Q(I+1) of a next succeeding register block 20-2(I+1); an NAND gate ND43 NANDing the output signals of the NAND gates ND41, ND42; and an edge trigger D-type flip-flop DFF41 synchronized by the sampling clock signal CLKS, and receiving an output signal of the NAND gate ND43 at its D input.

The operation of the above-described conventional digital delay-locked loop will now be described with reference to FIG. 5.

First, register blocks 20-2(1)~20-2(N) are all reset at the initial stage. At this time, the input clock signal CLKR is passed through the variable delay time block 20 and a feedback loop, namely the reference delay block 10, produce an initial internal clock signal CLKI(0). The phase detector 30 outputs the shift right signal SHR regardless of the phase relationship between the input clock signal CLKR and the initial internal clock signal CLKI(0). The value of the Ith register block 20-2(I) in the variable delay block 20 is determined in accordance with the phase comparison signals SHR/SHL and the output signals Q(I−1), Q(I+1) of the I−1th and I+1th register blocks 20-2(I−1), 20-2(I+1) at a rising edge of the sampling clock signal CLKS, and the value is incremented by one step according to the sampling clock signal CLKS from the initial stage with phase synchronization.

At this time, in order to guarantee a margin for inputting the feedback clock signal CLKI delayed by the sampling clock signal CLKS to the phase detector 30 before being re-delayed by the next sampling clock signal CLKS, the sampling clock signal CLKS become an input clock signal CLKR divided by two in the clock divider 30-1.

As shown in FIG. 5, when a high section of the feedback clock signal CLKI delayed to a rising edge of the input clock signal CLKR is detected, it is located at a phase detect region PD region. In the case that a low section of a feedback clock signal CLKI(I) delayed due to a sampling clock signal CLKS to a rising edge of the input clock signal CLKR by repeating a delay operation as long as the unit delay time TD for every rising edge of the sampling clock signal CLKS, is detected, the phase is synchronized. Here, the phase detector 30 outputs the shift left signal SHL, the unit delay time TD is advanced by one step due to a sampling signal CLKS, and thus the phase of the feedback clock signal CLKI(I) is identical to that of a I−1th feedback clock signal CLKI(I−1). The phase detector 30 outputs the shift right signal SHR by the phase relation between the input clock signal CLKR and the I−1th feedback clock signal CLKI(I−1), an initial feedback clock signal CLKI(0) is delayed by one step due to a sampling clock signal CLKS, and thus the phase of the feedback clock signal CLKI(0) is identical to that of the I-th feedback clock signal CLKI(I). That is, the feedback clock signal CLKI interrupts an operation of the delay-locked loop for as long as the unit delay time TD to the input clock signal CLKR, and the output clock signal CLKQ and the feedback clock signal CLKI become low. However, the previous values are saved in the phase detector 30 and the register block chain 20-2 of the variable delay time block 20. When the external clock signal CLKX is inputted, the unit delay time TD before the input clock signal CLKR is intercepted is set and a phase synchronized operation is performed.

The time to the initial phase synchronization in accordance with the conventional art is as follows.

A minimum loop delay time is represented by the following equation.

$$Tml = td + tref \quad (1)$$

At this time, the number of stages N of the unit delay time TD demanded until the phase synchronization is obtained by the following equation.

$$N = (Tclk - Tml)/TD \quad (2)$$

The time Tlock to the phase synchronization is represented by the following equation.

$$Tlock = CLKS * N \quad (3)$$

That is, when the equation 'Tclk−Tml>TD' is satisfied, the time to the phase synchronization is obtained by the following equation.

$$Tlock = 2Tclk(Tclk - Tml)/TD \quad (4)$$

The synchronization time is in proportion to the square of Tclk. When the minimum loop delay time Tml is determined, the synchronization setting time may be lengthened at low frequency, namely, when the clock period is long.

Especially, in case the relation 'Tclk/2>Tml' is satisfied, a longer unit delay time TD is demanded until the feedback clock signal CLKI is located within the initial phase detect region.

However, such an operation obstructs rapid synchronization setting, and consequently, becomes an disadvantage in an integrated circuit demanding a rapid synchronization setting.

In addition, the conventional phase-locked loop PLL and delay-locked loop DLL utilize analog circuits such as a charge pump and a voltage controlled oscillator VCO in order to perform a phase synchronization operation of an input clock signal and an internal clock signal, and require multiple cycles for performing the phase synchronization. Therefore, a synchronous dynamic random access memory SDRAM which must operate a synchronized to an input clock signal and which has an active mode (read/write operation) and a refresh mode is not capable of achieving a rapid phase synchronization in converting its operation from the refresh mode while cutting off the input clock signal to the active mode for low-power operation. That is, the SDRAM cannot cut off the input clock signal for rapid operation conversion, and thus there is a disadvantage that the SDRAM cannot perform a low-power operation.

Further, in the worst case, the phase of a rising edge of the first feedback clock signal is different from that of a target rising edge by one period. Here, in order to lock to a target edge, various delay factors are demanded, and thus it takes a longer time to lock. Especially, in case of a low-frequency clock signal whose period is long, it takes a much longer time to lock.

SUMMARY OF THE INVENTION

Accordingly, it is an object of the present invention to reduce power consumption by controlling the delay time digitally, saving synchronization information in registers, and performing synchronization of an internal clock signal to an external clock signal within a short time by utilization of the synchronization information when returning to normal operation after intercepting an input clock signal.

In order to achieve the above-stated object, there is provided a digital delay-locked loop including: a reference delay block for determining a phase relationship between an internal clock signal and an external clock signal; a variable delay block consisting of a delay chain having unit delay time and a register chain, for controlling a delay time; a phase detector for comparing a phase of a feedback clock signal delayed by the reference delay block with that of the external input clock signal; and a trigger pulse generator outputting a transfer pulse in accordance with a phase comparison control signal and a lock signal outputted from the phase detector.

BRIEF DESCRIPTION OF THE DRAWINGS

The present invention will become better understood with reference to the accompanying drawings which are given only by way of illustration and thus are not limitative of the present invention, wherein:

FIG. 9A–9L is an operation timing diagram of the digital delay-locked loop in FIG. 6.

DETAILED DESCRIPTION OF THE INVENTION

Figure 1:
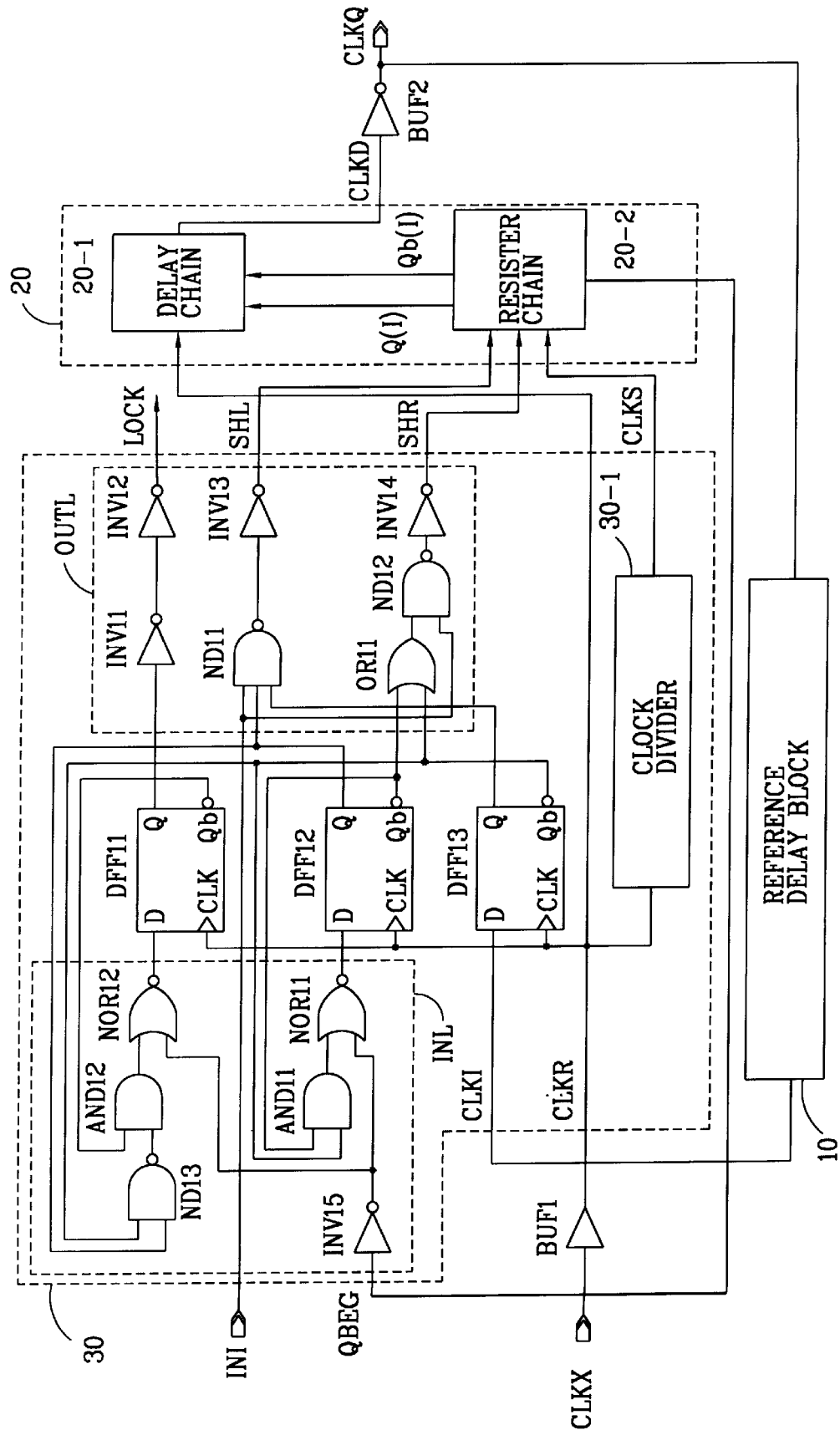
FIG. 1 is a block diagram of a conventional digital delay-locked loop.
Figure 2:
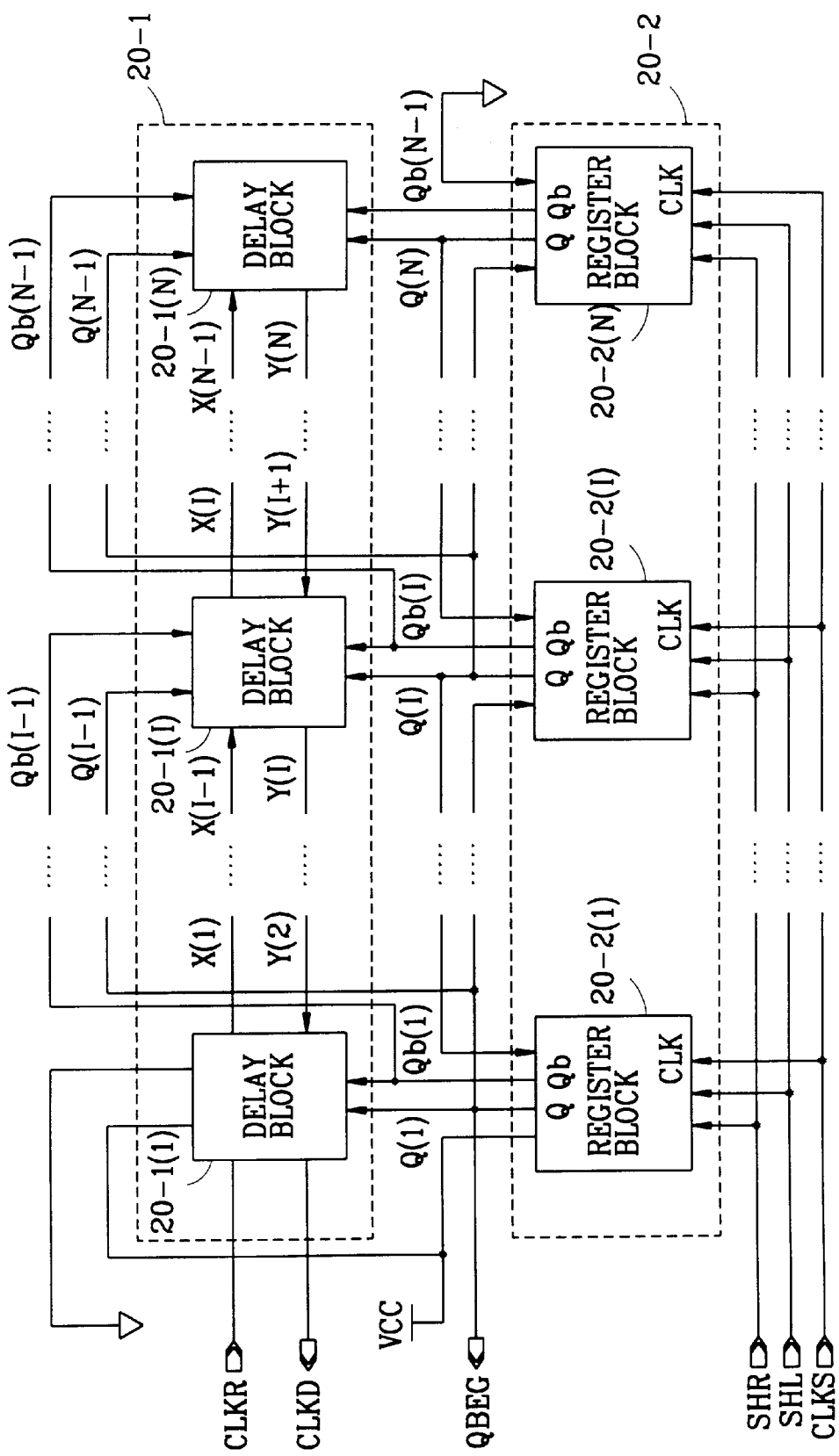
FIG. 2 is a detailed circuit diagram of a variable delay block illustrated in FIG. 1.
Figure 3:
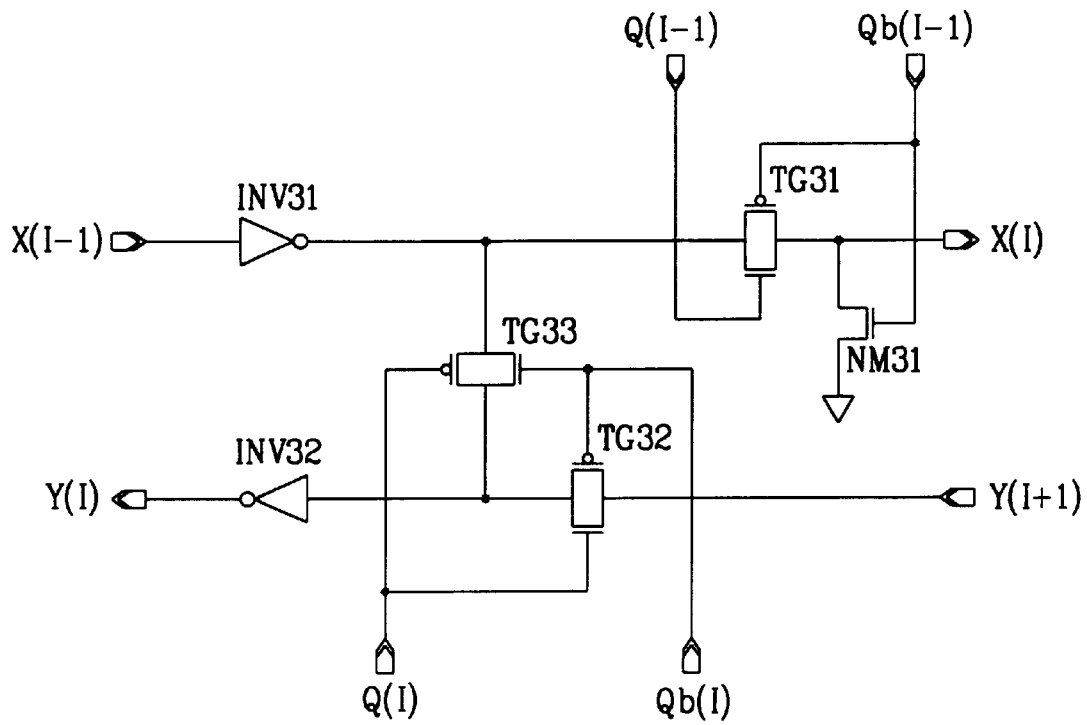
FIG. 3 is a detailed circuit diagram of a delay block of a delay chain in the variable delay block illustrated in FIG. 2.
Figure 4:
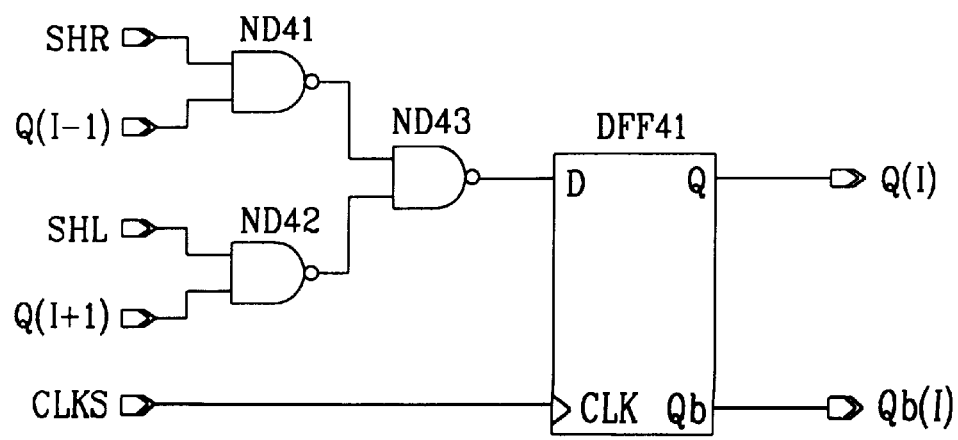
FIG. 4 is a detailed circuit diagram of a register block of a register chain in the variable delay block illustrated in FIG. 2.
Figure 5:
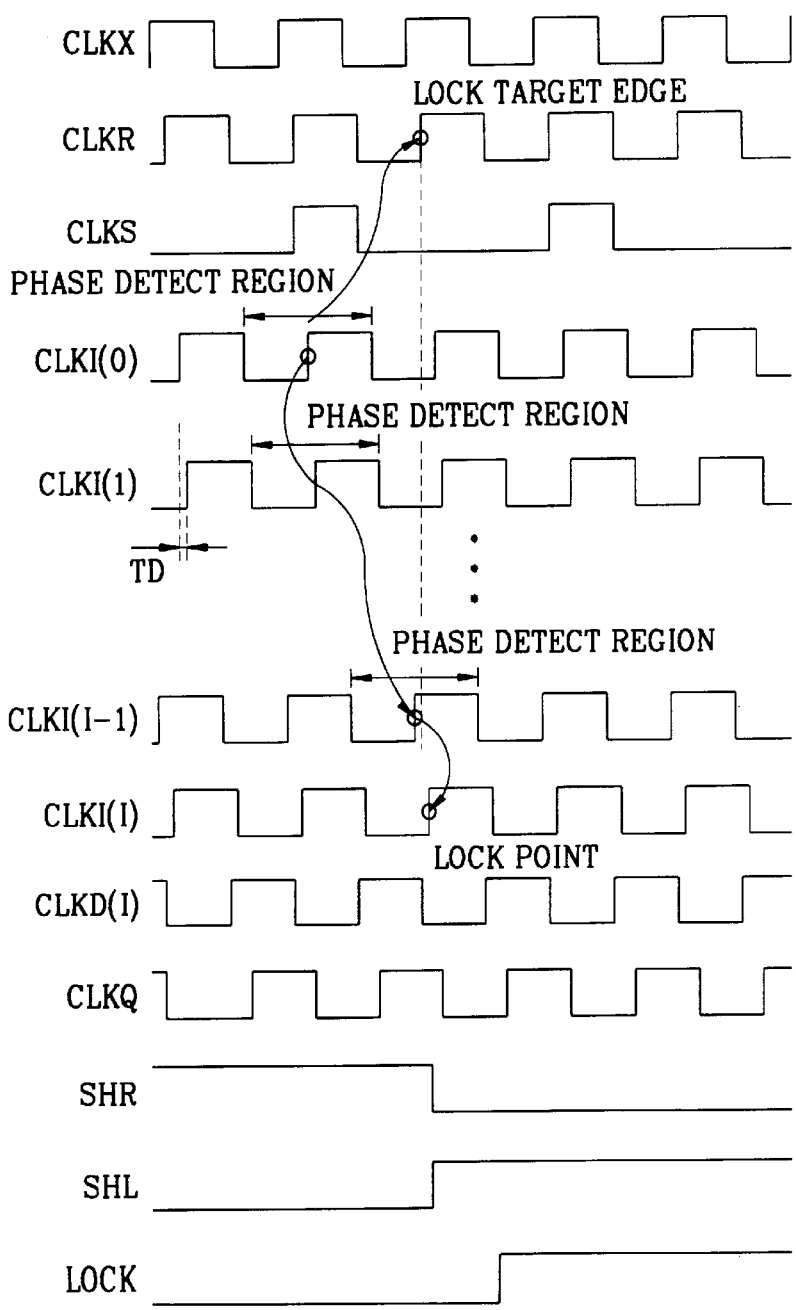
FIGS. 5A–5L is an operation timing diagram of the digital delay-locked loop in FIG. 1.
Figure 6:
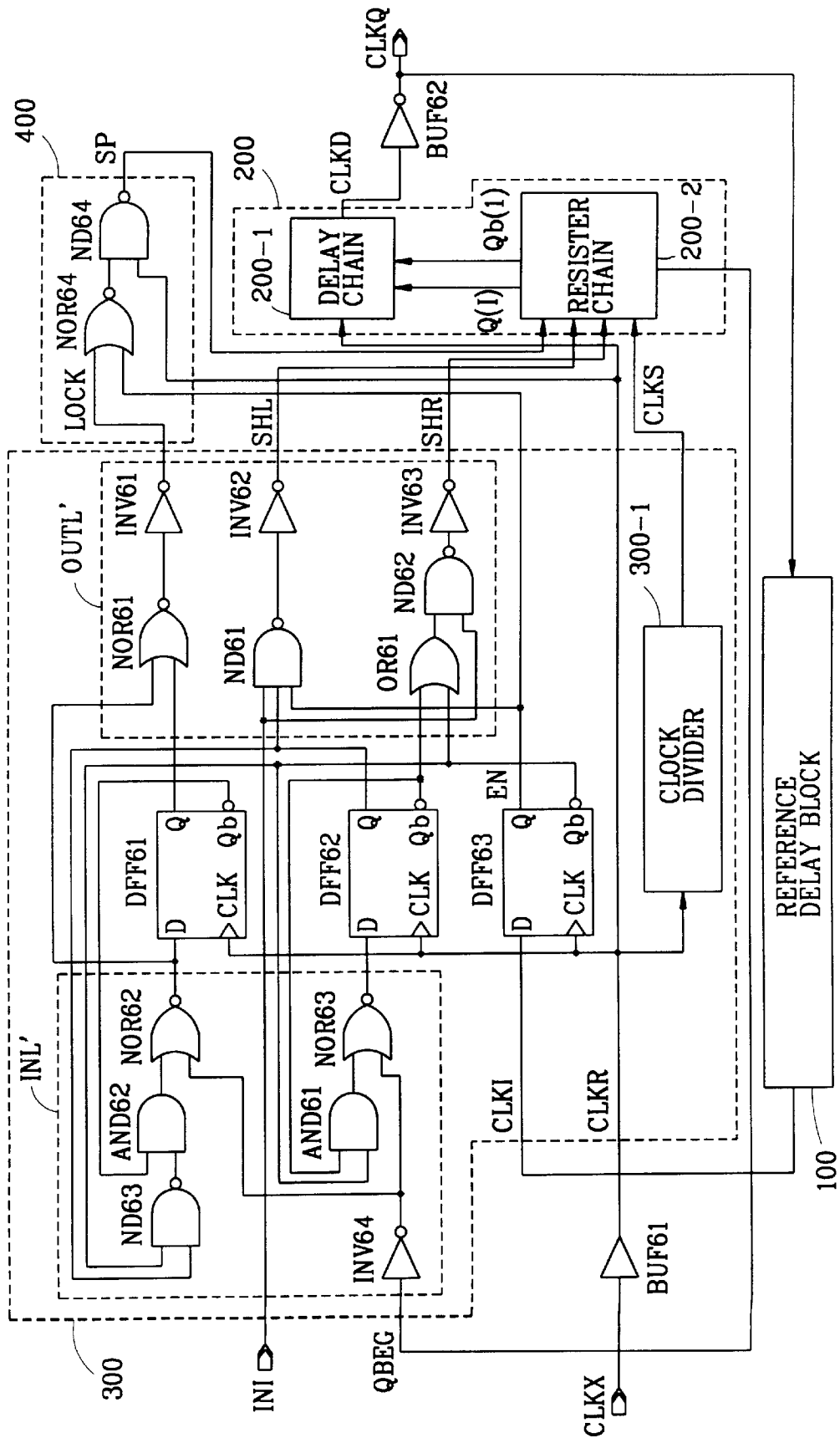
FIG. 6 is a block diagram of a digital delay-locked loop in accordance with the present invention.

As illustrated in FIG. 6, according to the present invention, there is provided a digital delay-locked loop which includes: an input buffer BUF61 buffering an externally inputted clock signal CLKX; an internal clock buffer BUF62 buffering a delayed clock signal CLKD and an internal load capacitance; a reference delay block 100 being a fixed delay element and determining a phase relationship of the buffered delayed clock signal CLKQ with the externally inputted clock signal CLKX; a variable delay block 200 consisting of a delay chain 200-1 (not shown) having an unit delay time TD and a register chain 200-2 (not shown), and controlling a delay time of the delayed clock signal CLKD; a phase comparison block 300 comparing the phase of a feedback clock signal CLKI delayed by the reference delay block 100 with that of the buffered inputted clock signal CLKR; and a trigger pulse generator 400 outputting a transfer pulse signal SP to the register chain 200-2 of the variable delay block 200.

The phase comparison block 300 includes: D type flip-flops DFF61–DFF63 all locked by the buffered input clock signal CLKR outputted from the input buffer BUF61; an output logic unit OUTL' logically operating upon output signals and inverted output signals of the flip-flops DFF61–DFF63, and an initialization signal INI, and outputting a synchronous signal LOCK, a shift right signal SHR and a shift left signal SHL; an input logic unit INL' logically operating upon a comparison signal QBEG outputted from the register chain 200-2 in the variable delay block 200 and the output and inverted output signals of the flip-flops DFF61–DFF63, and driving the D inputs of the flip-flops DFF61–DFF62; and a clock divider 300-1 dividing the buffered input clock signal CLKR by two and outputting a sampling clock signal CLKS.

The output logic unit OUTL' includes: a NOR gate NOR61 which NORs the D input signal and the Q output of the first flip-flop DFF61; an inverter INV61 inverting an output signal of the NOR gate NOR61 and outputting the synchronous signal LOCK; a NAND gate ND61 NANDing the initialization signal INI and the Q output signals of the second and third flip-flops DFF62, DFF63; an inverter INV62 inverting an output signal of the NAND gate ND61 and outputting the shift left signal SHL; an OR gate OR61 which ORs the inverted Qb output signals of the second and third flip-flops DFF62, DFF63; a NAND gate NANDing the output signal of the OR gate OR61 and the initialization signal INI; and an inverter INV63 inverting the output signal of the NAND gate ND62 and outputting the shift right signal SHR.

The input logic unit INL' includes: an inverter INV64 inverting the comparison signal QBEG outputted from the register block 200-2 at the variable delay block 200; an AND gate AND61 which ANDs the inverted Qb output signals of the second and third flip-flops DFF62, DFF63; a NOR gate NOR63 which NORs an output signal of the AND gate AND61 and an output signal of the inverter INV64 and drives the D input of the second flip-flop DFF62; a NAND gate ND63 NANDing the Q output signal of the second flip-flop DFF62 and the inverted Qb output signal of the third flip-flop DFF63; an AND gate AND62 which ANDs the output signal of the NAND gate NAND63 and the inverted Qb output signal of the first flip-flop DFF61; and a NOR gate NOR62 which NORs the output signal of the AND gate AND62 and the output signal of the inverter INV64 and drives the D input of the first flip-flop DFF61.

The trigger pulse generator 400 includes: a NOR gate NOR63 which NORs the lock signal outputted from the inverter INV61 of the output logic unit OUTL' and the Q output signal of the third flip-flop DFF63 which serves as a phase comparison control signal EN; and a NAND gate ND64 which NORs the output signals of a NOR gate NOR64 with the buffered input clock signal CLKR to output the transfer pulse signal SP.

Figure 7:
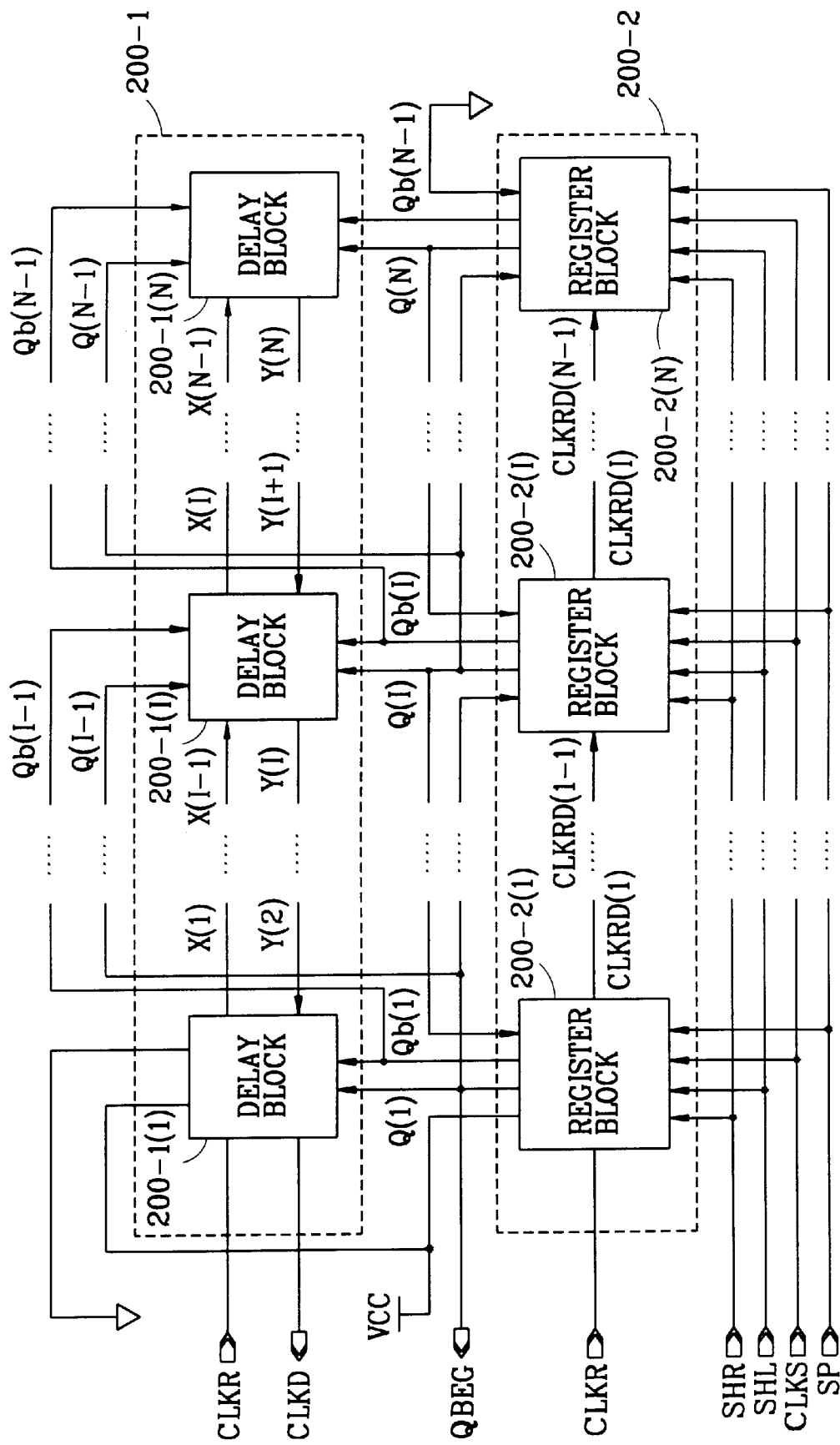
FIG. 7 is a detailed circuit diagram of a variable delay block illustrated in FIG. 6.
Figure 8:
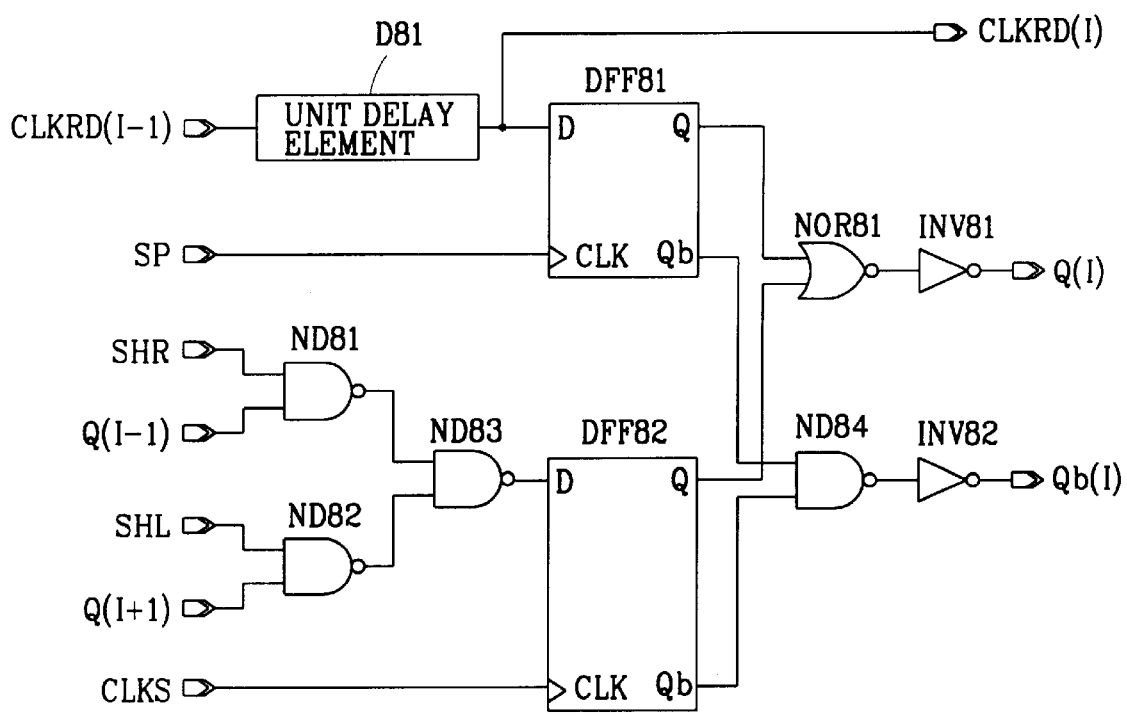
FIG. 8 is a detailed circuit diagram of a register block of the variable delay block illustrated in FIG. 6.

Referring to FIG. 7, the delay chain 200-1 of the variable delay block 200 of the delay-locked loop in accordance with the present invention is identical in constitution to the conventional one. However, the Ith register blocks 200-2(1) ~200-2(N) in the register chain 200-2 are of a different constitution and are all synchronized by receiving the transfer pulse SP as an input signal thereto. Referring to FIG. 8, the exemplary I-th register block 200-2(I) includes: a unit delay element D81 delaying a delayed input clock signal CLKRD(I−1) outputted from a next preceding register block 200-2(I−1); a first D type flip-flop DFF81 to the D input of which is synchronized by the transfer pulse signal SP and a delayed input clock signal CLKRD(I) outputted from the unit delay element D81 is inputted; a NAND gate ND81 NANDing the shift right signal SHR and an output signal Q(I−1) of the next preceding register block 200-2(I−1); a NAND gate ND82 NANDing the shift left signal SHL and an output signal Q(I+1) of a next succeeding register block 200-2(I+1); a NAND gate ND83 NANDing the respective output signals of the NAND gates ND81, ND82; a second D type flip-flop DFF82 to the clock input of which the sampling clock signal CLKS is inputted and to the D input of which an output signal of the NAND gate ND83 is inputted; a NOR gate NOR81 which NORs the Q output signals of the flip-flops DFF81, DFF82; an inverter INV81 inverting an output signal of the NOR gate NOR81 and outputting an output signal Q(I) of the Ith register block 200-2(I); a NAND gate ND84 NANDing the inverted Qb output signals of the flip-flops DFF81, DFF82; and an inverter INV82 inverting an output signal of the NAND gate ND84 and outputting an inverted output signal Qb(I) of the Ith register block 200-2(I).

The operation of the above-described digital delay-locked loop in accordance with the present invention will now be explained with reference to the accompanying drawings, as follows.

First, in order to reduce the initial phase synchronization time, the respective phases of a first feedback clock CLKI(0) and the buffered input clock signal CLKR are compared.

As shown in FIG. 7, when a lock target edge is not located within the phase detection region, the phase comparison control signal EN and the synchronous signal LOCK are turned to be low in the phase detector 300, and thus the transfer pulse signal SP is generated by the trigger pulse generator 400.

Therefore, the flip-flops at each stage of the register chain 200-2, in synchronization with the transfer pulse signal SP sample the input clock signal CLKRD from the preceding block delayed by as long as the unit delay time TD and generate output values Q, Qb of the respective register block 200-2 at intervals of the unit delay time TD.

In this way, as shown in FIG. 9, a second feedback clock signal CLKI(1) is delayed by as long as Tclk/2 and located in the phase detect region.

Accordingly, when the phase comparison control signal EN is turned to be high and the trigger pulse generator 400 does not generate the transfer pulse signal SP, and the current output values Q(I+1), Qb(I+1) of the first flip-flop are constantly kept. As output values Q(I), Qb(I) from the second flip-flop DFF82 are outputted in accordance with the sampling clock signal CLKS, the output values Q(I+1), Qb(I+1) are logically operated by the output logic unit OUTL. When the feedback clock signal is delayed due to the sampling clock signal CLKS, and thereby the phase is synchronized, as the phase comparison control signal EN is turned to be low and the synchronous signal LOCK is turned to be high, the transfer pulse SP is not generated and a jitter operation is performed as in the conventional art.

In accordance with the present invention, the time to the initial phase synchronization is as follows;

First, the minimum loop delay time Tml is represented by the following equation.

$$Tml = TD + Tbuf2 + Tref \quad (5)$$

Here, the number of stages N required for obtaining the phase synchronization is obtained by the following equation.

$$N = (Tclk - Tml)/TD \text{(when } Tclk - Tml > 0) \quad (6)$$

Especially, when the relation Tclk/2>Tml is satisfied, the time required for achieving the phase synchronization Tlk is represented by the following equation.

$$Tlk = CLKS*[N - Tclk/(2*TD)] \quad (7)$$

That is, Tlk=2Tclk(Tclk/2−Tml)/TD (when Tclk−Tml>0)

When the relation Tclk/2>Tml is satisfied, the difference in the phase setting time between the present invention and the conventional digital delay-locked loop is obtained by the following equation.

$$Tdel\ Tlk\_old - Tlk\_new = Tclk^2 \quad (8)$$

That is to say, according to the present invention, frequency limitation in a rapid synchronization system can be avoided because rapid synchronization setting time can be obtained at a low-frequency where the relation Tclk/2>Tml is satisfied, as different from the conventional art.

As a trigger pulse generator is used in the present invention, a shifted delay can be detected and delay state corresponding to a maximum value of a half period of a clock signal can be saved to a lock target rising edge of an input clock signal. Therefore, the synchronization time is reduced, and thereby the operation time of the delay-locked loop is also reduced, resulting in operation power reduction during the predetermined time.

In addition, in accordance with the present invention, when an external clock signal is suspended, as a lock point can be rapidly found, mis-operation because internal signals of a circuit are not synchronized to external signals can be minimized.

As the present invention may be embodied in several forms without departing from the spirit of essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A digital delay-locked loop comprising:
   a reference delay block that receives an internally generated delayed clock signal and generates a feedback clock signal;
   a variable delay block including a delay chain having an unit delay line and a register chain to output the internally generated delayed clock signal in response to an externally inputted clock signal, wherein the variable delay block controls a delay time of the internally generated delayed clock signal;
   a phase comparison block for comparing a phase difference between the feedback clock signal delayed by the reference delay block and the externally inputted clock signal; and
   a trigger pulse generator for generating a transfer pulse signal in accordance with a phase comparison control signal and a lock signal outputted from the phase comparison block and the externally inputted clock signal.

2. The digital delay-locked loop of claim 1, wherein the trigger pulse generator comprises:
   a first logic gate that receives the lock signal and the phase comparison control signal; and
   a second logic gate that receives an output signal from the first logic gate and the externally inputted clock signal and generates the transfer pulse signal.

3. The digital delay-locked loop of claim 2 wherein the first logic gate is a
   a NOR gate for NORing the phase comparison control signal and the lock signal, and
   the second logic gate is a NAND gate.

4. The digital delay-locked loop of claim 2, wherein the transfer pulse signal is generated once when both the phase comparison control signal and the lock signal are a low logic level.

5. The digital delay-locked loop of claim 1, wherein the phase comparison block comprises:
   an input logic circuit that receives a comparison signal, an initialization signal, and at least one of a plurality of flip-flop output signals and generates first and second input logic circuit output signals;
   a plurality of flip-flops coupled to the input logic circuit to receive the first and second input logic circuit output signals, the feedback clock signal and the externally inputted clock signal, and that generates the flip-flop output signals, wherein the phase comparison control signal is one of the flip-flop output signals; and
   an output logic circuit coupled to the plurality of flip-flops and the input logic circuit to receive the first input logic circuit output signal, a subset of the plurality of flip-flop output signals, the initialization signal and the phase comparison control signal, and that generates the lock signal, a shift left signal and a shift right signal.

6. The digital delay-locked loop of claim 5, wherein the plurality of flip flops comprises first, second and third D flip-flops synchronized by the externally inputted clock signal, wherein the input logic circuit comprises:

a first inverter for inverting the comparison signal generated by the variable delay block;

a first AND gate for ANDing an inverted output signal of the second flip-flop and an inverted output signal of the third flip-flop;

a first NOR gate for NORing an output signal of the first AND gate and an output signal of the first inverter to generate the first input logic circuit output that is transmitted to a data input of the second flip-flop;

a first NAND gate for NANDing an output signal of the second flip-flop and the inverted output signal of the third flip-flop;

a second AND gate for ANDing an output signal of the first NAND gate and an inverted output signal of the first flip-flop; and a second NOR gate for NORing an output signal of the second AND gate and the output signal of the first inverter to generate the second input logic circuit output signal that is transmitted to an input of the first flip-flop, wherein the output logic circuit comprises, a third NOR gate for NORing the output signal of the second NOR gate and an output signal of the first flip-flop;

a second inverter for inverting an output signal of the third NOR gate and outputting the lock signal;

a second NAND gate for NANDing the initialization signal and the output signal of the second flip-flop and an output signal of the third flip-flop;

a third inverter for inverting an output signal of the second NAND gate and outputting the shift left signal;

an OR gate for ORing the inverted output signals of the second and third flip-flops;

a third NAND gate for NANDing an output signal of the OR gate and the initialization signal; and a fourth inverter for inverting an output signal of the third NAND gate and outputting the shift right signal.

7. The digital delay-locked loop of claim 1, wherein the register chain receives the transfer pulse signal, a divided signal of the externally inputted clock signal, first and second output signals of the phase comparison block and generates a plurality of first and second register chain output signals, and the delay chain receives the externally inputted clock signal and the first and second register chain output signals and generates a comparison signal.

8. The digital delay-locked loop of claim 7, wherein the register chain includes a plurality of register blocks, each register block comprising:

a first register block circuit that receives the transfer pulse signal and an input signal from a preceding register block, and generates a unit delay output signal and a corresponding one of each of the first and second register chain output signals; and a second register block circuit that receives the first and second output signals of the phase comparison block, the input signals from the preceding register block and an input signal of a succeeding register block and the divided signal, and generates first and second outputs of the second register block circuit.

9. The digital delay-locked loop of claim 8, wherein the first register block circuit comprises:

a unit delay element that receives the input signal from the preceding register block and generates the unit delay output signal;

a first register block flip flop that receives the transfer pulse signal and the unit delay output signal;

a first logic gate that receives a first output of the first register block flip flop and the first output of the second register block circuit and generates a first logic gate output;

a second logic gate that receives a second output of the first register block flip flop and the second output of the second register block circuit and generates a second logic gate output; and third and fourth logic gates that respectively receive the first and second logic gate outputs and generate the corresponding one of said each of the first and second register chain output signals.

10. The digital delay-locked loop of claim 9, the second register block circuit comprises:

a first NAND gate for NANDing a shift right signal and an output signal of the preceding register block;

a second NAND gate for NANDing a shift left signal and an output signal of the succeeding register block;

a third NAND gate for NANDing output signals of the first and second NAND gates; and a second register block flip-flop configured for receiving an output signal of the third NAND gate and the divided signal.

11. A digital delay-locked loop, comprising:

a phase detector that receives a delayed external clock signal, a feedback clock signal, a comparison signal and a control signal, compares a difference between the feedback clock signal and the delayed external clock signal, and generates a divided clock signal, a phase comparison control signal, a lock signal and first and second shift signals;

a trigger pulse generator coupled to the phase detector that receives the lock signal, the delayed external clock signal and the phase comparison control signal and generates a transfer pulse signal;

a variable delay block coupled to the phase detector and the trigger pulse generator that receives the first and second shift signals, the divided clock signal, the delayed external clock signal, and the transfer pulse signal and generates a delayed output clock signal and the comparison signal; and a reference delay block that receives the delayed output clock signal and generates the feedback clock signal.

12. The digital delay-locked loop of claim 11, wherein the trigger pulse generator comprises:

a first logic gate that receives the lock signal and the phase comparison control signal and generates a first logic gate output; and a second logic gate that receives the first logic gate output and the externally inputted clock signal and generates the transfer pulse signal.

13. The digital delay-locked loop of claim 12, wherein the first logic gate is a NOR gate and the second logic gate is a NAND gate.

14. The digital delay-locked loop of claim 11, wherein the variable delay block includes a register chain having a plurality of register blocks, each register block comprising:

a first register block circuit that receives the transfer pulse signal and an input signal from a preceding register block and generates a unit delayed output signal and a corresponding one of each of a plurality of first and second register chain output signals; and a second register block circuit that receives the first and second shift signals of the phase detector, input signals from the preceding register block and a succeeding register block and the divided clock signal and generates first and second outputs of the second register block.

15. The digital delay-locked loop of claim 14, wherein the first register block circuit comprises:
   a unit delay element that receives the input signal from the preceding register block and generates the unit delayed output signal;
   a first register block flip flop that receives the transfer pulse signal and the unit delayed output signal;
   a first logic gate that receives a first output of the first register block flip flop and the first output of the second register block and generates a first logic gate output;
   a second logic gate that receives a second output of the first register flip flop and the second output of the second register block and generates a second logic gate output; and
   first and second inverters that respectively receive first and second logic gate outputs and generate the corresponding one of said each of the first and second register chain output signals.

16. The digital delay-locked loop of claim 15, wherein the first logic gate is a NOR gate and the second logic gate is a NAND gate.

17. The digital delay-locked loop of claim 14, the second register block circuit comprising:
   a first logic gate that receives the first shift signal of the phase detector, and an output signal from the preceding register block and generates a first logic gate output;
   a second logic gate that receives the second shift signal of the phase detector and an output signal from the succeeding register block and generates a second logic gate output;
   a third logic gate that receives the first logic gate output and the second logic gate output and generates a third logic gate output; and
   a second register block flip-flop that receives the third logic gate output and the divided clock signal and generates the first and second outputs of the second register block.

18. The digital delay-locked loop of claim 17, wherein the first, second and third logic gates are NAND gates, and the first and second shift signals of the phase detector are respectively a shift right signal and a shift left signal.

19. The digital delay-locked loop of claim 11, wherein the phase detector comprises:
   an input logic circuit that receives the comparison signal, the control signal, and at least one of a plurality of flip-flop output signals and generates first and second input logic circuit output signals;
   a plurality of flip-flops coupled to the input logic circuit to receive the first and second input logic circuit output signals, the feedback clock signal and the delayed external clock signal, and that generates the flip-flop output signals, wherein the phase comparison control signal is one of the flip-flop output signals; and
   an output logic circuit coupled to the plurality of flip-flops and the input logic circuit to receive the first input logic circuit output signal, a subset of the plurality of flip-flop output signals, the control signal and the phase comparison control signal, and that generates the lock signal, the first shift signal and the second shift signal.

* * * * *